United States Patent [19]

Staudinger et al.

[11] Patent Number: 5,265,269
[45] Date of Patent: Nov. 23, 1993

[54] INTERMEDIATE FREQUENCY INDEPENDENT STAR MIXER

[75] Inventors: Joseph Staudinger; Warren L. Seely; John M. Golio, all of Chandler, Ariz.

[73] Assignee: Motorola, Inc., Schaumburg, Ill.

[21] Appl. No.: 718,726

[22] Filed: Jun. 21, 1991

[51] Int. Cl.⁵ .............................. H04B 1/26
[52] U.S. Cl. ..................... 455/330; 455/333; 307/529
[58] Field of Search .......... 455/118, 325-326, 455/330, 333; 307/529; 333/32

[56] References Cited

U.S. PATENT DOCUMENTS

| | | | |
|---|---|---|---|
| 4,531,236 | 7/1985 | Ishihara | 455/330 |
| 4,603,436 | 7/1986 | Butler | 455/333 |
| 4,896,374 | 1/1990 | Waugh et al. | 455/326 |
| 5,060,298 | 10/1991 | Waugh et al. | 455/326 |

Primary Examiner—Reinhard J. Eisenzopf
Assistant Examiner—Andrew Faile
Attorney, Agent, or Firm—Robert M. Handy; Frederick M. Fliegel

[57] ABSTRACT

An apparatus for mixing electrical signals including in combination: first signal splitting means having a radio frequency (RF) port and first, second, third and fourth signal ports, second signal splitting means having a local oscillator (LO) port and first, second, third and fourth signal ports, intermediate frequency (IF) port, and mixer element means, the mixer element means coupled to the first, second, third, and fourth signal ports of the first and second signal splitting means and coupled to the intermediate frequency port means, for mixing two of the RF, IF, and LO signals to produce the remaining signal.

25 Claims, 6 Drawing Sheets

INTERMEDIATE FREQUENCY INDEPENDENT STAR MIXER

CROSS-REFERENCE TO RELATED APPLICATION

This application is related to co-pending patent application No. 07/719,202 filed Jun. 21, 1991 entitled "High isolation mixer," which is assigned to the same assignee as the present application.

FIELD OF THE INVENTION

The present invention concerns an improved means and method for mixing electrical signals.

BACKGROUND OF THE INVENTION

It is commonplace in the electronic art to combine a modulated or modulating signal with a local oscillator signal in order to obtain a further modulated signal at another frequency that is more easily amplified, filtered, broadcast, and/or detected. This is done in a mixer.

In a typical demodulation application, a modulated radio frequency (RF) signal is combined in a mixer with a local oscillator (LO) signal to produce an intermediate frequency (IF) signal which may be then further amplified and detected to recover the information modulated onto the RF carrier. Alternatively, this process can be reversed, mixing an LO signal with an IF signal to produce a modulated carrier (RF) signal for further amplification and ultimate transmission as a modulated output signal.

The demodulation mixing process produces sum and differences of the RF and LO frequencies. One or more of the sum and difference frequencies is at the desired IF frequency, according to the following relations:

$f_{IF} = f_{LO} - f_{RF}$, i.e., down conversion where
$f_{LO} > f_{RF}$. (1)

$f_{IF} = f_{RF} - f_{LO}$, i.e., down conversion where
$f_{LO} < f_{RF}$. (2)

$f_{IF} = f_{LO} + f_{RF}$, i.e., up conversion.

Similar relations apply to modulation of a carrier signal.

Examination of equations (1) and (2) shows that there is not a unique correspondence between $f_{LO}$, $f_{IF}$, and $f_{RF}$. For a given value of $f_{LO}$, two different values of $f_{RF}$ may produce the same value of $f_{IF}$. For example, (see FIG. 1) for $f_{LO} = 3$ GigaHertz, both $f_{RF1} = 2.5$ GigaHertz and $f_{RF2} = 3.5$ GigaHertz can produce $f_{IF} = 0.5$ GigaHertz. The RF and IF frequencies are generally not discrete frequencies but narrow frequency bands determined by the modulation thereon. The LO frequency is typically sharply defined, but may be time varying in some cases.

A prior art double balanced mixer apparatus 10 is illustrated in FIG. 2. Mixer apparatus 10 comprises input 12, input 42, output 15, balun transformers 16, 40, and four port mixer element 19 comprising diodes 32, 34, 36, 38, and having input ports 24, 26, 28, 30. Signals 14, 18, 20, 44, 46, 48 are present in mixer apparatus 10. RF input signal 14 comprising either or both RF1 and RF2 enters at RF port 12. Balun transformer 16 splits incoming signal 14 into two substantially equal amplitude RF signals 18, 20 which have a relative phase displacement of 180°. Signal 18 is sent to port 24 of four port mixer element 19 and signal 20 is sent to port 28 of mixer element 19. Similarly, LO input 42 supplies LO signal 44 to balun transformer 40. Balun transformer 40 splits LO signal 44 into two substantially equal amplitude RF signals 46, 48 having a 180° relative phase displacement. Signal 46 is sent to port 26 of four port mixer element 19 and signal 48 is sent to port 30 of four port mixer element 19.

The nonlinear current versus voltage characteristics of diodes 32, 34, 36, 38 cause signals to be created at frequencies in accordance with equations 1–3, which signals are coupled to IF port 15. Because balun transformers 16, 40 must be able to pass the RF, LO, and IF frequencies, the required bandwidth of the balun transformers is more difficult to realize. Furthermore, balun transformers such as 16, 40 are generally most useful at frequencies below about one GigaHertz. This limits the frequency range over which prior art mixer apparatus 10 is useful.

Alternatively, mixers are employed for modulation of an LO signal by an IF signal to produce a modulated carrier, or RF signal. This process is similar to the demodulation process described above, with LO port 42 and IF port 15 accepting input signals and RF port 12 providing an output signal.

Prior art mixers have a number of disadvantages well known in the art. Among these disadvantages are, for example: (1) inadequate port-to-port isolation, (2) limited bandwidth, particularly intermediate frequency bandwidth, (3) relative complexity and (4) difficulty of implementation in compact form suitable for incorporation in monolithic microwave integrated circuits (MMIC's).

MMIC's are typically constructed using Si, GaAs, or other compound or elemental semiconductor integrated circuit (IC) wafer processing technology on and/or in such wafers. It is highly desirable to have broadband mixers which can be made with lumped elements or other structures that are compatible with IC fabrication techniques and geometries. In particular, it is important that they be of comparatively small size so as to not occupy disproportionately large substrate areas compared to the semiconductor diodes, transistors, etc., which mix the signals, or compared to the amplifiers or other signal processing elements that may be included in the MMIC. Such concerns are especially important in the frequency range from about 1 to 15 GigaHertz and above where the sizes of distributed circuit elements are unwieldy.

Thus, there continues to be a need for improved broadband mixers and methods that use few components, especially those which are easy to construct and/or which employ elements that are readily integratable in and/or on MMIC's or the like.

SUMMARY OF THE INVENTION

In accordance with the present invention, there is provided a novel apparatus for mixing electrical signals including in combination: first signal splitting means having a radio frequency port for coupling a radio frequency signal and first, second, third and fourth signal ports, second signal splitting means having a local oscillator port for coupling a local oscillator signal and first, second, third and fourth signal ports, intermediate frequency port means for coupling an intermediate frequency signal to or from an external electronic apparatus, and five port mixer element means, the five port mixer element means coupled to the first, second, third and fourth signal ports of the first and second signal splitting means and coupled to the intermediate frequency port means, for mixing two of the radio frequency, local oscillator, or intermediate frequency signals to produce the third signal.

A method is provided for broadband mixing of a first electrical signal having at least a first frequency with a second signal having at least a second frequency to form a third signal having at least a third frequency comprising the steps of: coupling the first electrical signal to a first phase shift array means having a first input port and first, second, third and fourth output ports, to provide first and third output signals differing in phase by 180° from second and fourth output signals, coupling the second electrical signal to a second phase shift array means having a first input port and first, second, third and fourth output ports, to provide fifth and seventh output signals differing in phase by 180° from sixth and eighth output signals, supplying the first and fifth output signals from the first output ports of the first and second phase shift array means to a first port of a five port mixer element, the second signal from the second output port of the first phase shift array means and the seventh signal from the third output port of the second phase shift array means to a second port of a five port mixer element, the third output signal from the third output port of the first phase shift array means and the sixth output signal from the third output port of the second phase shift array means to a third port of a five port mixer element, the fourth and eighth output signals from the fourth output ports of the first and second phase shift array means to a fourth port of a five port mixer element, and mixing the signals present at the first, second, third and fourth input ports, to create the third signal from the first and second signals.

The foregoing method and means provides a mixing apparatus having increased bandwidth of operation.

DESCRIPTION OF THE PREFERRED EMBODIMENT

As used herein, the abbreviation "I/O" is intended to refer to a port or other connection which either receives or sends signals or both. The designations "LO", "RF", and "IF" in connection with mixer apparatus are solely for convenience of explanation and not intended to be limiting or to imply that the ports so identified may not have other functions or receive or send the same or different signals of the same or different frequencies. Also as used herein, the term "splitting/combining" is intended to refer to an apparatus, device or element which may function to split an input signal into multiple portions appearing at multiple output ports or combining multiple signals appearing at the same multiple ports into an output signal appearing in place of the input signal.

Figure 3:
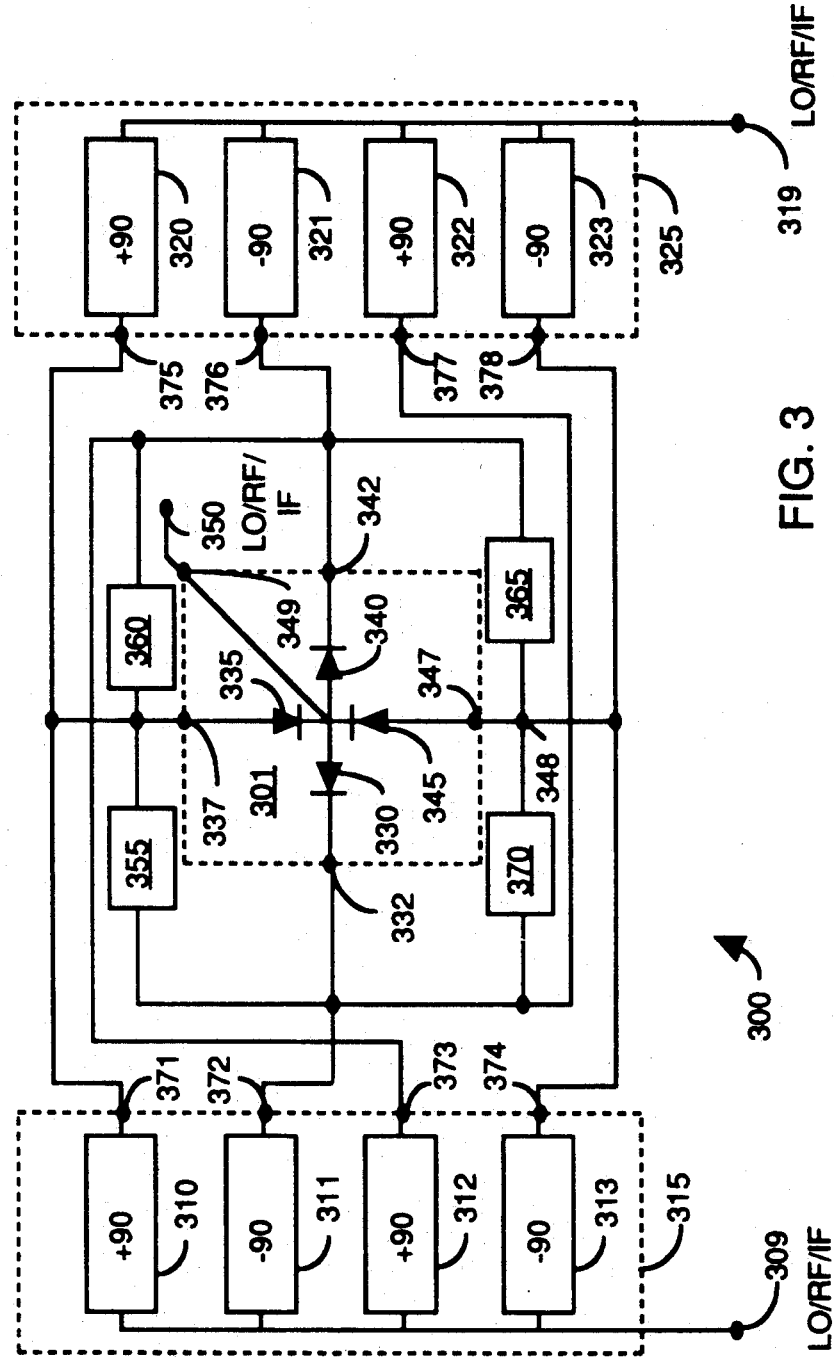
FIG. 3 is a schematic diagram of a broadband mixer circuit in accordance with a preferred embodiment of the present invention.

FIG. 3 is a schematic diagram of broadband mixing apparatus 300 circuit in accordance with a preferred embodiment of the present invention. Mixing apparatus 300 comprises first and second phase shift network arrays 315, 325 having phase shift networks 310, 311, 312, 313 and 320, 321, 322, 323, with associated ports 371, 372, 373, 374, and 375, 376, 377, 378, respectively. Each phase shift network array is shown as a dashed rectangle with four internal boxes which represent different paths between ports of the phase shift network array. The number inside each box identifies the relative phase shift through that network. For example, as a portion of a signal incident upon network 310 (or 312) of first phase shift network array 315 passes through the "+90" path to port 371 (or 373), it undergoes a relative phase shift of +90°. Similarly, incident signal energy passing through the "−90" path of network 311 (or 313) to port 372 (or 374) undergoes a relative phase shift of −90°, with the result that signals incident on I/O port 309 emerge from ports 371, 373 of first phase shift network array 315 with a net phase difference of 180° relative to signals emerging from ports 372, 374. Similarly, signals entering at ports 371-374 undergo the indicated net phase differences before emerging at port 309.

Those of skill in the art will understand that the phase shift amounts indicated in FIG. 3 are relative phase shift amounts and not absolute phase shift amounts. Those of skill in the art will also recognize that while a given network or port may have a designation of input or output or both in a given modulation or demodulation application of mixing apparatus 300, any port 309, 319, 371, 372, 373, 374, 375, 376, 377, 378 of phase shift network arrays 315 or 325 can function as an input, an output, or as both.

First and second phase shift network arrays 315, 325 are coupled to I/O port 309 (e.g., LO) and I/O port 319 (e.g., RF). Diodes 330, 335, 340, 345 of five port mixer element 301 are coupled to central node 349, which is coupled to I/O port 350 (e.g., IF). Diodes 330, 335, 340, 345 are also coupled through ports 332, 337, 342, 347, to matching element means 355, 360, 365, and 370, to networks 310, 311, 312, and 313 of first phase shift network array 315 and to networks 320, 321, 322, and 323 of second phase shift network array 325.

Diodes 330, 335, 340, 345 are conveniently arranged in a star-like configuration, that is, four diodes connected to a common (fifth) node. It is preferred to have two diodes with cathodes connected to the common node and two diodes with anodes connected to the common node.

Improved bandwidth of mixing apparatus 300 operation is obtained by coupling of matching elements 355, 360, 365, 370 to ports 332, 337, 342, 347 of mixer element 301. Matching element 355 is coupled between ports 337 and 332 of mixer element 301; matching element 360 is coupled between ports 337 and 342 of mixer element 301; matching element 365 is coupled between ports 342 and 347 of mixer element 301; and matching element 370 is coupled between ports 347 and 332 of mixer element 301. Matching elements 355, 360, 365, 370 minimize electrical reflections of signals from I/O port 350 and first and second phase shift array means 315, 325. Matching elements 355, 360, 365, 370 may comprise inductors, capacitors, resistors, or a combination thereof, but preferably are inductors, or inductor-capacitor combinations (e.g., series resonant circuits), chosen to maximize power transfer to the diodes 330, 335, 340, 345, in accordance with design principles well known in the art.

Signals are applied to ports of five port mixer element 301 where they combine two of the RF, IF and LO frequency signals to produce the remaining signal. The RF and LO frequency signals cancel at node 349, while the IF signals do not. The relative phase, $\phi_{IF}$, of the intermediate frequency signal associated with each diode is given by the relations:

$$\phi_{IF} = \phi_{LO} - \phi_{RF} + \phi_D \text{ (down conversion to IF)}, \quad (4)$$

$$\phi_{IF} = \phi_{RF} + \phi_{LO} + \phi_D \text{ (up conversion to IF)}. \quad (4)$$

where $\phi_D$ is the diode phase, with a value of 0° corresponding to a diode which has the cathode connected to the central node, and where $\phi_D$ is 180° otherwise. Further, $\phi_{RF}$ is the phase of the received radio frequency signal at one diode (e.g. node 332 of FIG. 3) relative to the phase at any other diode (e.g., nodes 337, 342, 347), and $\phi_{LO}$ is the relative phase of the LO frequency signal, similarly measured from one diode to another. $\phi_{IF}$ of equation 4 is the relative phase of the intermediate frequency signal which is produced by signals RF and LO, when the intermediate frequency is the difference of the RF and LO frequencies. $\phi_{IF}$ of equation 5 is the relative phase of the intermediate frequency signal when it is the sum of the RF and LO signal frequencies. The phase states for this example are given below in Table I. Equations (4)-(5) and the identification of the relative phase of the various signals are explained, for example, in B. J. Hallford, "Trace Phase States to Check Mixer Designs," *Microwaves*, June 1980, pages 52-60. The $\phi_{IF}$ values given in Table I show that the IF signals are in phase with one another at central node 349.

TABLE I

| Diode and signal phases for mixer element 301. | | | | |
|---|---|---|---|---|
| Diodes | 335 | 330 | 345 | 340 |
| $\phi_{LO}$ | +90 | −90 | −90 | +90 |
| $\phi_{RF}$ | +90 | +90 | −90 | −90 |
| $\phi_D$ | 0 | 180 | 0 | 180 |
| $\phi_{IF}$ | 0 | 0 | 0 | 0 (equation 4) |
| $\phi_{IF}$ | 180 | 180 | 180 | 180 (equation 5) |

Signals from I/O (e.g., RF) port 319 arriving at mixer ports 332, 337, 342, 347 are of substantially the same amplitude. Those signals from networks 310, 312 of first phase shift network array 315 are 180° out of phase with those from networks 311, 313. Similarly, signals from I/O (e.g., LO) port 309 arriving at mixer ports 332, 337, 342, 347 are of substantially the same amplitude. Those signals from networks 320, 322 of second phase shift network array 325 are 180° out of phase with those from networks 321, 323. The nonlinear voltage versus current characteristics of diodes 330, 335, 340, 345 combine these signals to provide an IF frequency signal appearing at central node 349 of five port mixer element 301. Central node 349 is thus a virtual ground except at the IF. This IF signal is coupled to I/O port 350.

Because signals from I/O ports 309 and 319 are delivered to five port mixer element 301 out of phase by 180°, their contributions to signals appearing at I/O port 350 cancel. This results in improved isolation of I/O port 350 from I/O port 319 and I/O port 309. Similarly, signals originating at I/O port 309 substantially cancel in passing through first and second phase shift network arrays 315, 325 and so are prevented from appearing at I/O port 319, and vice versa. This is advantageous in that radio frequency receivers employing such mixers can avoid radiating LO signal power with little or no need for incorporation of additional filtering. This is further advantageous in that the IF port filtering requirements are similarly minimized with respect to signals introduced at both I/O port 309 and I/O port 319.

A further advantage of the invented arrangement is that only one type of phase shift array is needed. Phase shift arrays 315 and 325 can be identical. This greatly simplifies construction of mixing apparatus 300.

The teachings of U.S. Pat. No. 5,023,576 "Broadband 180 degree hybrid," issued to J. Staudinger and W. L. Seely, are hereby incorporated by reference.

Figure 4:
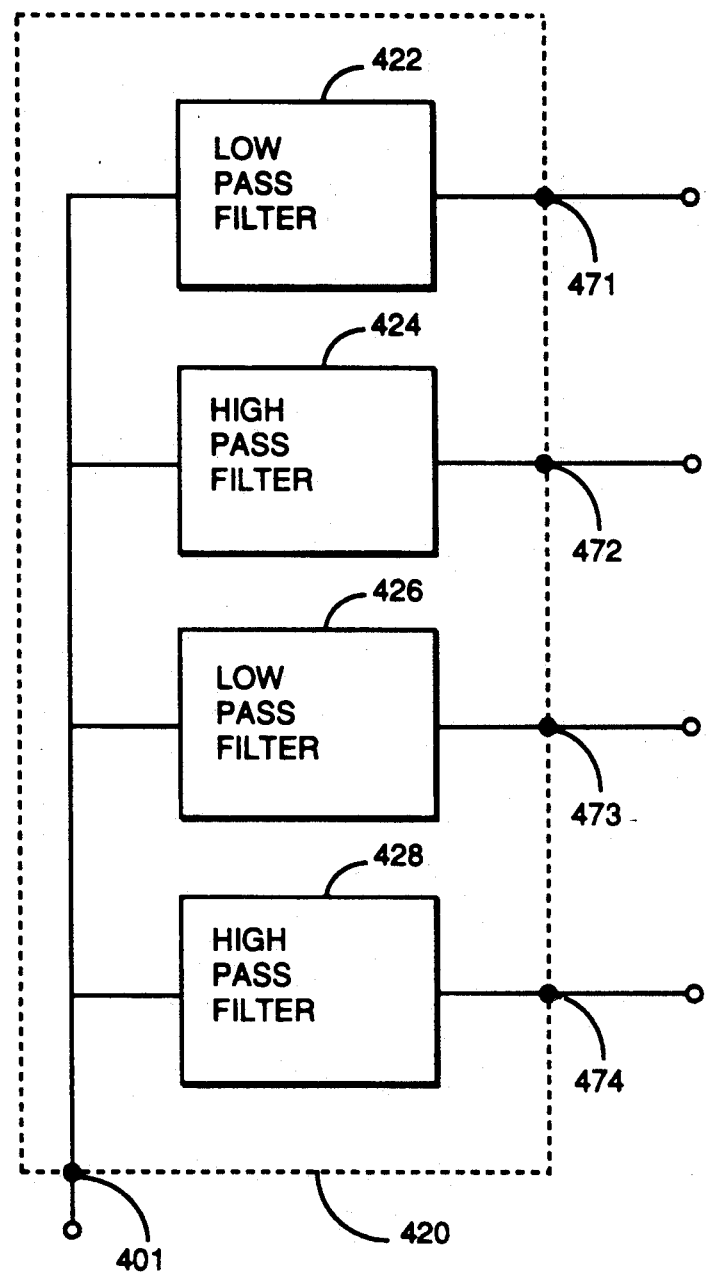
FIG. 4 is a schematic diagram of a phase shift network including filter means in accordance with the present invention.

FIG. 4 represents a convenient method for realizing first and second phase shift network arrays 315, 325 depicted in FIG. 3. FIG. 4 schematically illustrates phase shifting network 420 comprising low pass filters 422, 426 and high pass filters 424, 428 coupled to a first input port 401, with low pass filter 422 coupled to port 471, high pass filter 424 coupled to port 472, low pass filter 426 coupled to port 473, and high pass filter 428 coupled to port 474. FIG. 4 corresponds to phase shift network array 315 of FIG. 3 as follows, for example: port 401 corresponds to port 309, network 422 to network 310, port 471 to port 371, network 424 to network 311, port 472 to port 372, network 426 to network 312, port 473 to port 373, network 428 to network 313, and port 474 to port 374. While any form of low pass and high pass networks suitable for the intended frequency range may be used, the arrangement of FIG. 5 is preferred.

Figure 5:
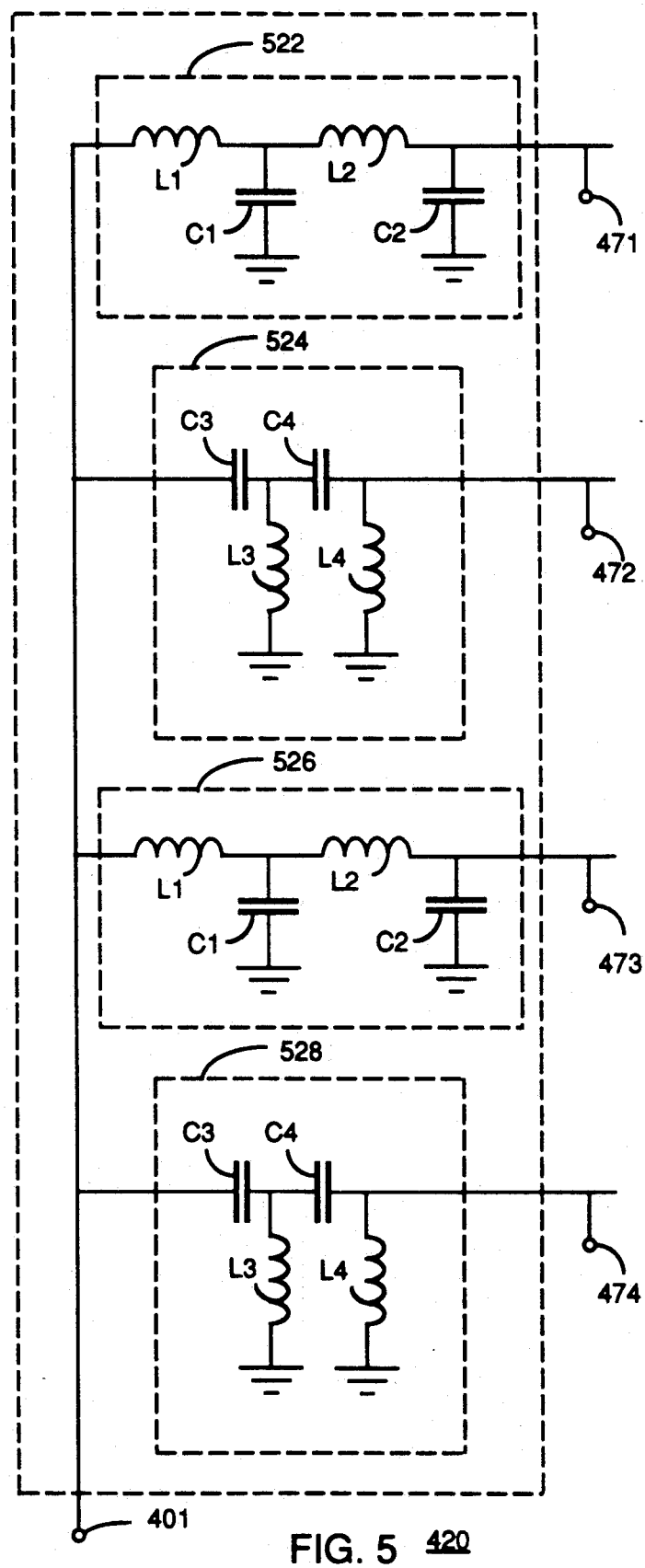
FIG. 5 is a schematic diagram of a circuit for realizing the circuit of FIG. 4 in MMIC form, in accordance with the present invention.

FIG. 5 provides a schematic diagram of a lumped-element realization of the functions shown in FIG. 4. FIG. 5 illustrates L-C phase shifting network 420 comprising fourth order low pass filters 522, 526 and fourth order high pass filters 524, 528 coupled to a first input port 401. For example, filters 522, 524, 526, and 528 of FIG. 5 correspond to filters 422, 424, 426, and 428 of FIG. 4.

Figure 1:
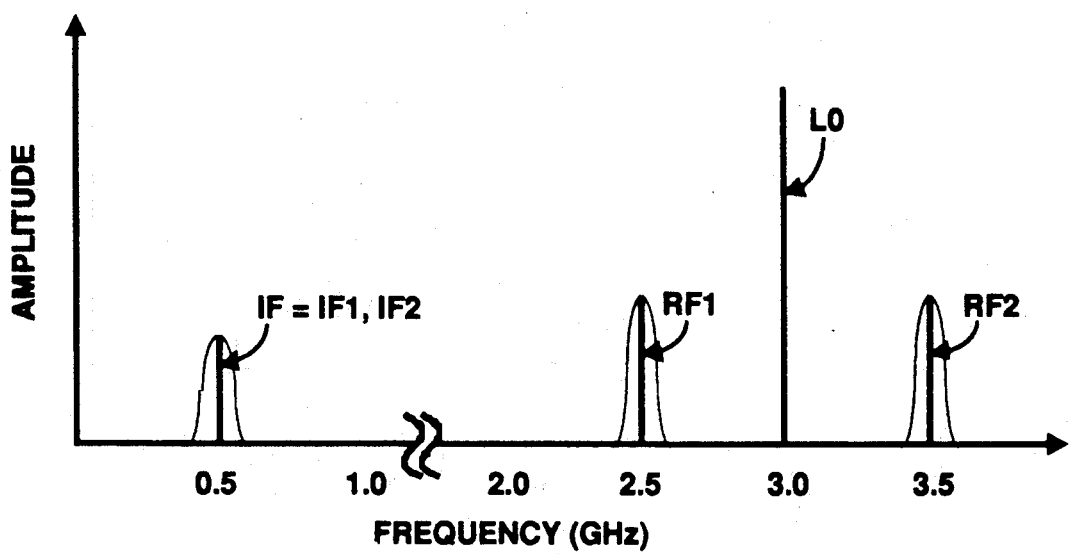
FIG. 1 is a simplified representation of RF, LO, and IF signals of different frequencies showing how RF signals RF1, RF2 are related in frequency to IF signals IF1, IF2.
Figure 2:
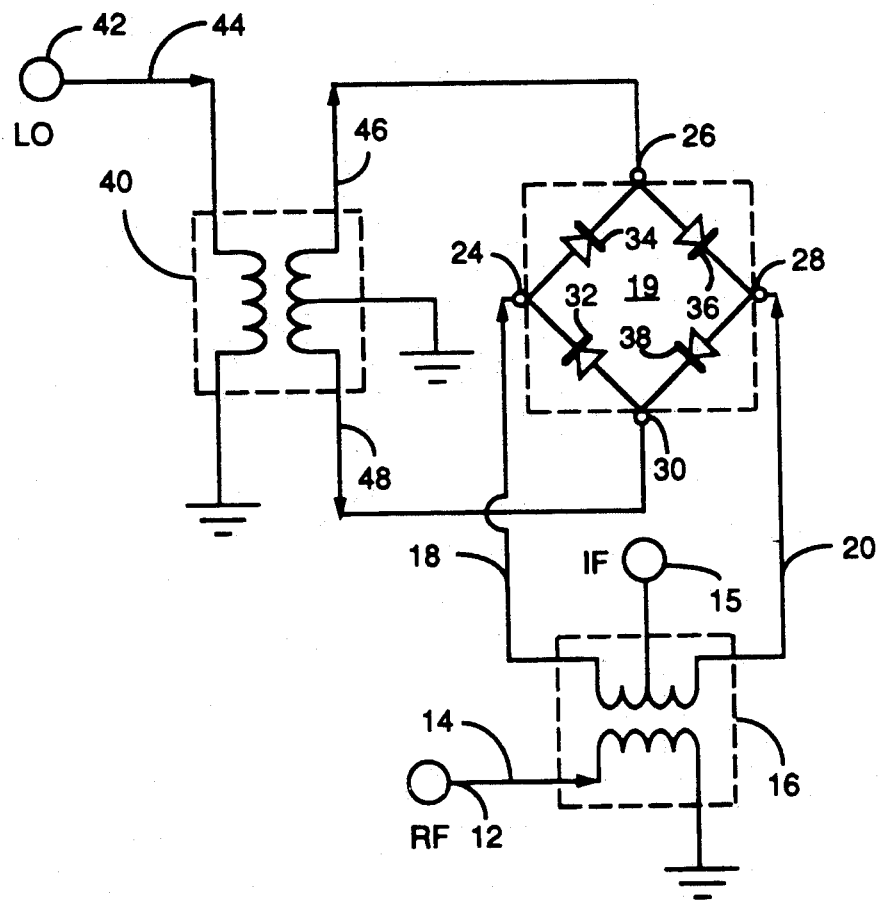
FIG. 2 is a simplified schematic representation of a double balanced mixer apparatus, according to the prior art.

Such an implementation provides substantial size reduction compared to prior art mixer apparatus 10, illustrated in FIG. 2. Balun transformers 16, 40 shown schematically in FIG. 2 are difficult to manufacture monolithically since they typically consist of a sintered ferromagnetic powder core with windings composed of enamel-insulated wire. This construction results in balun transformer 16, 40 assemblies which are at least several millimeters on a side and which must be individually placed and then soldered to a circuit board to form mixer apparatus 10. The balun transformers are further incapable of achieving the bandwidth requirements imposed by RF and LO frequencies in the range of 12 to 22 GigaHertz, for example, together with a yet broader IF range of one to forty two GigaHertz, for example.

The lumped element circuits depicted in FIG. 5 are easily mass produced by photolithographic techniques well known in the art. These lumped elements are typically a fraction of a millimeter on a side and are formed already interconnected to one another, reducing assembly labor.

Typical diode parameters appropriate to 60 by 0.25 micrometer junction area Schottky barrier diodes (e.g., diodes 330, 335, 340, 345 of FIG. 3) fabricated on epitaxially grown gallium arsenide material are a zero bias capacitance of 0.072 picoFarads, together with a series resistance of 9 ohms. Referring to FIG. 5, typical values of L1-L4 and C1-C4 for operation in the RF and LO frequency range of 12 to 22 GigaHertz are L1=0.358 nanoHenries, L2=0.633 nanoHenries, L3=0.779 nanoHenries, L4=1.37 nanoHenries, C1=0.113 picoFarads, C2=0.063 picoFarads, C3=0.244 picoFarads, and C4=0.138 picoFarads. The foregoing L, C, and diode parameter values were used for the lumped elements of FIG. 5 to model the performance of the circuit depicted in FIGS. 3-5. The results are illustrated in FIGS. 6 and 7.

Figure 6:
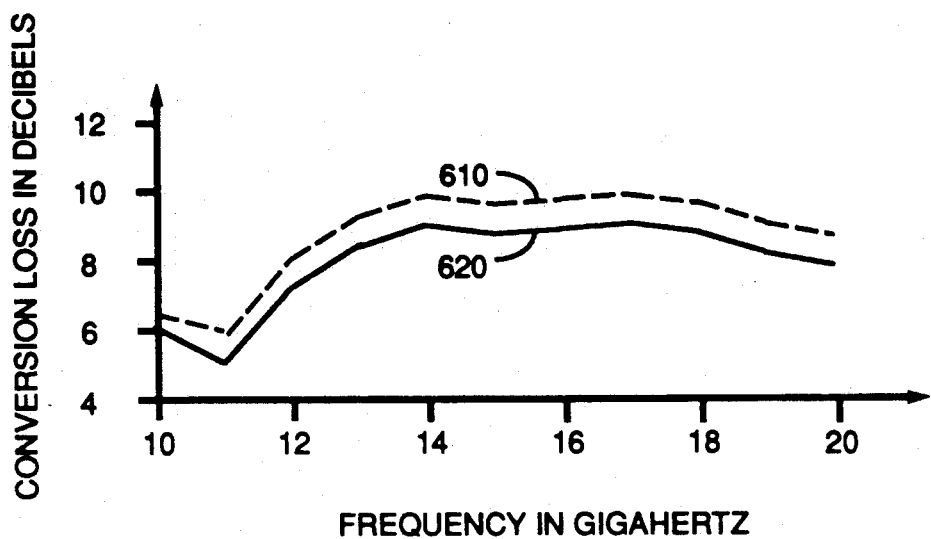
FIG. 6 is a graph of the predicted conversion loss and bandwidth of downconversion operation for the mixing apparatus.

FIG. 6 graphically depicts the predicted downconverter conversion loss versus frequency for the circuit of FIG. 3, when a 22 GigaHertz LO signal, having a fixed power level of +12 dBm, and an RF signal, swept from 10 to 20 GigaHertz, are mixed to provide IF signals ranging from 12 to two GigaHertz. The data shown in the trace 610 of FIG. 6 indicate very flat, resonance-free 2 dB bandwidths extending from 12 to 20 GigaHertz, together with a conversion loss not exceeding about 10 dB. Trace 620 of FIG. 6 corresponds to trace 610 for an LO power level of +14 dBm.

Figure 7:
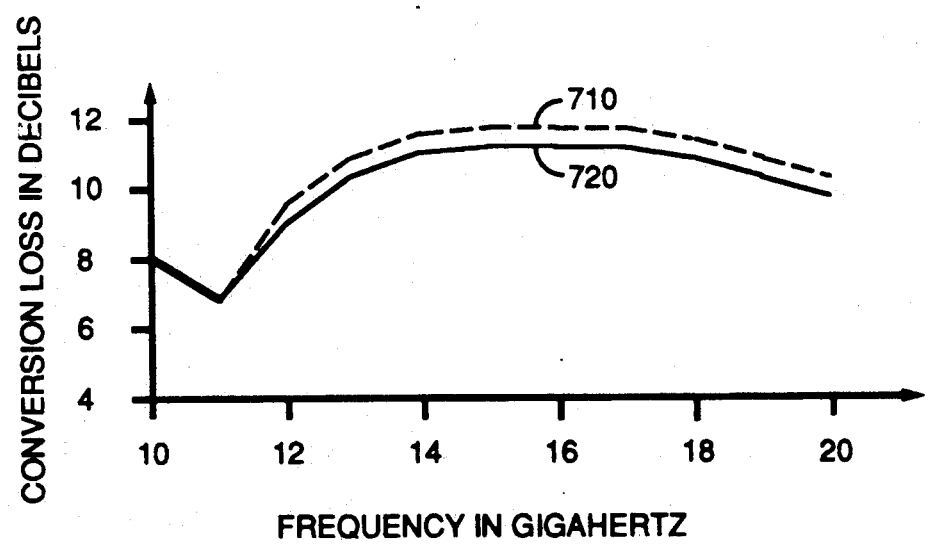
FIG. 7 is a graph of the predicted conversion loss and bandwidth of upconversion operation for the mixing apparatus.

FIG. 7 graphically illustrates the predicted upconverter conversion loss versus frequency 710 for the circuit of FIG. 3 when a 22 GigaHertz LO signal, having a fixed power level of +12 dBm, and an RF signal, swept from 10 to 20 GigaHertz, are mixed to provide IF signals ranging from 32 to 42 GigaHertz. Trace 720 of FIG. 7 corresponds to trace 710 for an LO power level of +14 dBm.

These lumped-element inductor and capacitor values, given by way of example, are determined by design tools well known in the art. This is done in accordance with the desire to couple RF and LO frequency signal power efficiently between phase shift network arrays 315, 325 and diodes 330, 335, 340, 345, and also to provide a low impedance and a constant degree of electrical impedance mismatch at ports 371, 372, 373, 374, 375, 376, 377, 378 at the intermediate frequency.

Matching element 355 is connected to ports 371 and 372 of first phase shift array means 315 and also to ports 375 and 377 of phase shift array 325. Ports 371 and 372 are of opposite phase to one another and so matching element 355 affects impedance matching of port 309. Ports 375 and 377 are of the same phase as one another and so matching element 355 does not affect impedance matching of port 319. Matching element 355 thus effects matching of port 309 without perturbation of the impedance matching achieved at port 319. Similarly, matching element 365 affects port 309 and not port 319 impedance matching, whilst matching elements 360 and 370 affect the impedance of port 319 without effect on the impedance matching of port 309. This orthogonality of the effects of matching elements 355, 365 to matching elements 360, 370 allows an additional degree of freedom in optimizing mixer apparatus 300 for a particular application having particular RF and LO frequencies. Were series matching elements employed, for example, in series between nodes 347 and 348 of mixer apparatus 300, all three of the RF, IF and LO frequency signals would be directly affected thereby. The matching element configuration of FIG. 3 thus provides an elegant and advantageous means for independent optimization of mixer apparatus 300 for each of the signals present, which is not possible for many other possible configurations and arrangements.

Inductors, capacitors and resistors such as are illustrated in FIGS. 3 and 5 may be readily fabricated using IC process techniques in a manner compatible with MMIC's. For example, resistors are formed from polycrystalline or single crystal semiconductor regions of various doping or by using thin film materials, as for example, NiCr, TiW, TaN, and the like. Capacitors are formed using metal layers or semiconductor layers or a combination thereof spaced apart by dielectrics otherwise available during IC fabrication, as for example, SiO, $SiO_2$, $Si_3N_4$, or combinations thereof. Inductors are formed using metal regions of spiral shape and/or other geometries well known in the art. Al and Au are non-limiting examples of metals commonly used for conductors in IC's. Means and methods for fabricating such conductor, resistor, capacitor and/or inductor elements using the same techniques employed in IC fabrication are well known in the art.

A method for broadband mixing of a first electrical signal having at least a first frequency with a second electrical signal having at least a second frequency to form a third electrical signal having at least a third frequency is provided, comprising the steps of: (1) coupling the first electrical signal to a first phase shift array means having a first input port and first, second, third and fourth output ports, to provide first and third output signals differing in phase by 180° from second and fourth output signals (2) coupling the second electrical signal to a second phase shift array means having a first input port and first, second, third and fourth output ports, to provide first and third output signals differing in phase by 180° from second and fourth output signals, (3) supplying the first output signals from the first ports of the first and second phase shift array means to a first port of a five port mixer, the second output signal from the second port of the first phase shift array means and the third output signal from the third port of the second phase shift array means to a second port of a five port mixer, the third output signal from the third port of the first phase shift array means and the second output signal from the second port of the second phase shift array means to a third port of a five port mixer, the fourth output signals from the fourth ports of the first and second phase shift array means to a fourth port of a five port mixer, and (4) mixing the signals present at the first, second, third and fourth input ports, to create the third signal from the first and second signals.

It is desirable but not essential that the method also include the step of providing matching element means coupled between each adjacent pairs of the four input ports of the five port mixer.

It is desirable but not essential that the method also include the step of supplying the output signals from the first and second phase shift means to distinct input ports of a five port diode star mixer.

It is desirable but not essential that the method also include the step of supplying signals of substantially equal amplitude derived from the first electrical signal via the first phase shift array means to the five port diode mixer.

It is desirable but not essential that the method also include the step of supplying signals of substantially equal amplitude and phase derived from the second electrical signal via the second phase shift array means to the five port diode mixer.

It is desirable but not essential that the method also include the step of providing matching element means which effect electrical impedance matching of the first input port of the first phase shift array means without perturbing the electrical impedance of the first input port of the second phase shift array means.

It is desirable but not essential that the method also include the step of providing matching element means which effect electrical impedance matching of the first input port of the second phase shift array means without perturbing the electrical impedance of the first input port of the first phase shift array means.

Based on the foregoing description, it will be apparent to those of skill in the art that the present invention provides an improved means and method for a broad bandwidth mixing apparatus which employs comparatively few components, which further may utilize a plurality of similar elements and so a minimum number of unique elements, which does not require strip lines and which employs lumped components most or all of which are readily fabricated on and/or in MMIC's with IC compatible technology. MMIC circuit implementations provide the advantages of small size, low weight, attractive high frequency performance, low noise figure, and reduced parts count for electronic systems.

While the present invention has been described in terms of particular arrangements, elements and methods, these are for convenience of explanation and not intended to be limiting. Although the preferred embodiment of the invention has been illustrated, and that form described in detail, it will be readily apparent to those of skill in the art that various modifications may be made therein without departing from the spirit of the invention or from the scope of the appended claims.

What is claimed is:

1. An apparatus for mixing electrical signals including in combination:
   first signal splitting/combining means having a first I/O port and first, second, third and fourth signal ports, said first I/O port for coupling a first frequency signal, said first signal splitting/combining means for splitting signals from said first I/O port to said first, second, third and fourth signal ports, or for combining signals from said first, second, third and fourth signal ports to said first I/O port, or both;
   second signal splitting/combining means having a second I/O port and first, second, third and fourth signal ports, said second I/O port for coupling a second frequency signal, said second signal splitting/combining means for splitting signals from said second I/O port to said first, second, third and fourth signal ports, or for combining signals from said first, second, third and fourth signal ports to said second I/O port, or both;
   third I/O port means for coupling a third frequency signal; and
   five port mixer element means, said five port mixer element means having first, second, third and fourth ports coupled to said first, second, fourth and third signal ports of said first signal splitting/combining means, respectively, said first, second, third and fourth ports of said five port mixer element means coupled to said first, third, fourth and second signal ports of said second signal splitting/combining means, respectively, and a fifth port of said five port mixer element means coupled to said third I/O port means, said five port mixer element means for mixing two of three signals comprising said first, second and third frequency signals to produce a remaining one of three signals comprising said first, second and third frequency signals.

2. Apparatus for mixing of electrical signals as claimed in claim 1, wherein said first and third signal ports of said first signal splitting/combining means provide 180° of phase shift relative to said second and fourth signal ports of said first signal splitting/combining means.

3. Apparatus for mixing of electrical signals as claimed in claim 1, wherein said first and third signal ports of said second signal splitting/combining means provide 180° of phase shift relative to said second and fourth signal ports of said second signal splitting/combining means.

4. Apparatus for mixing of electrical signals as claimed in claim 1, wherein said first and second signal splitting/combining means further comprise filters.

5. Apparatus for mixing of electrical signals as claimed in claim 4, wherein said filters comprise monolithic microwave electrical circuits.

6. Apparatus for mixing of electrical signals as claimed in claim 1, wherein said five port mixer element means comprises a star mixer element means.

7. Apparatus for mixing of electrical signals as claimed in claim 1, wherein said apparatus for mixing electrical signals receives as said first frequency signal a radio frequency signal and as said second frequency signal a local oscillator signal, to produce an intermediate frequency signal as said third frequency signal.

8. Apparatus for mixing of electrical signals as claimed in claim 1, wherein said apparatus for mixing electrical signals receives said third signal as an intermediate frequency signal and said second frequency signal as a local oscillator signal signal, to produce said third frequency signal as a radio frequency signal.

9. A method for mixing of a first electrical signal having at least a first frequency with a second electrical signal having at least a second frequency to form a third electrical signal having at least a third frequency, comprising the steps of:
   coupling said first electrical signal to a first phase shift array means having a first input port and first, second, third and fourth output ports, to provide first and third output signals differing in phase by 180° from second and fourth output signals;
   coupling said second electrical signal to a second phase shift array means having a first input port and first, second, third and fourth output ports, to provide fifth and seventh output signals corresponding to said first and third output ports, respectively, differing in phase by 180° from sixth and eighth output signals corresponding to said second and fourth output ports, respectively;
   supplying said first and fifth output signals from said first output ports of said first and second phase shift array means to a first port of a five port mixer element means, said second output signal from said second output port of said first phase shift array means and said seventh output signal from said third output port of said second phase shift array means to a second port of said five port mixer element means, said third output signal from said third output port of said first phase shift array means and sixth output signal from said second output port of said second phase shift array means to a third port of said five port mixer element means, said fourth and eighth output signals from said fourth output ports of said first and second phase shift array means to a fourth port of said five port mixer element means; and mixing signals present at said first, second, third and fourth ports of said five port mixer element means, to create said third electrical signal at a fifth port of said five port mixer element means from said first electrical signal and said second electrical signal.

10. A method for mixing of electrical signals as claimed in claim 9, further including the step of providing first, second third and fourth matching element means coupled to each adjacent pair of said first, second, third and fourth ports of said five port mixer element means for impedance matching said five port mixer element means to said first and second phase shift array means, wherein said first matching element means is coupled between said first and second ports of said five port mixer element means, said second matching element means is coupled between said second and third ports of said five port mixer element means, said third matching element means is coupled between said third and fourth ports of said five port mixer element means and said fourth matching element means is coupled between said fourth and first ports of said five port mixer element means.

11. A method for mixing of electrical signals as claimed in claim 10, wherein said step of providing matching element means further includes the step of providing matching element means comprising inductors.

12. A method for mixing of electrical signals as claimed in claim 11, wherein said step of providing inductors further includes the step of providing inductors comprising monolithic microwave integrated elements.

13. A method for mixing of electrical signals as claimed in claim 10, wherein said steps of coupling further include the step of filtering said first and second electrical signals.

14. A method for mixing of electrical signals as claimed in claim 13, wherein said step of filtering further includes the step of filtering by means of fourth order filter circuits.

15. A method for mixing of electrical signals as claimed in claim 9, wherein said step of supplying further includes the step of supplying said fifth, sixth, seventh and eighth output signals of substantially equal amplitude derived from said second electrical signal via said second phase shift array means to said five port mixer element means.

16. A method for mixing of electrical signals as claimed in claim 9, wherein said step of supplying further includes the step of supplying said first, second, third and fourth output signals of substantially equal amplitude derived from said first electrical signal via said first phase shift array means to said five port mixer element means.

17. A method for mixing of electrical signals as claimed in claim 10, wherein said step of providing matching element means further includes the step of providing matching element means which effect electrical impedance matching of said first input port of said first phase shift array means without perturbing the electrical impedance of said first input port of said second phase shift array means.

18. A method for mixing of electrical signals as claimed in claim 10, wherein said step of providing matching element means further includes the step of providing matching element means which effect electrical impedance matching of said first input port of said second phase shift means without perturbing the electrical impedance of said first input port of said first phase shift array means.

19. Apparatus for mixing of a first electrical signal having at least a first frequency with a second electrical signal having at least a second frequency to form a third electrical signal having at least a third frequency, comprising:

first phase shift array means having first, second, third and fourth phase shift networks; an input port means for coupling said first electrical signal; and first, second, third and fourth output ports, for providing a phase reversal from one output port pair with respect to another output port pair;

second phase shift array means having first, second, third and fourth phase shift networks; an input port means for coupling said second electrical signal; and first, second, third and fourth output ports, for providing a phase reversal from one output port pair with respect to another output port pair;

mixer element means having first, second, third and fourth input ports and a fifth output port, said first input port being connected to said first output ports of said first and second phase shift means, said second input port being connected to said second output port of said first phase shift means and to said third output port of said second phase shift means, said third input port being connected to said fourth output ports of said first and second phase shift means, said fourth input port being connected to said third output port of said first phase shift means and to said second output port of said second phase shift means, said mixer element means for providing said third electrical signal at said fifth output port; and first, second, third and fourth matching element means, said first matching element means coupled between said first and second input ports of said mixer element means, said second matching element means coupled between said second and third input ports of said mixer element means, said third matching element means coupled between said third and fourth input ports of said mixer element means, said fourth matching element means coupled between said fourth and first input ports of said mixer element means, for providing impedance matching of said mixer element means and said first and second phase shift array means.

20. Apparatus for mixing of electrical signals as claimed in claim 19, wherein said first, second, third, and fourth matching element means comprise inductors.

21. Apparatus for mixing of electrical signals as claimed in claim 19, wherein said first and second phase shift array means comprise lumped element monolithic microwave circuits.

22. Apparatus for mixing of electrical signals as claimed in claim 20, wherein said inductors comprise monolithic microwave electronic elements.

23. Apparatus for mixing of electrical signals as claimed in claim 19, wherein said first and second phase shift array means comprise fourth order filter circuits.

24. Apparatus for mixing of electrical signals as claimed in claim 19, wherein said first and third matching element means affect matching of said first phase shift array means without affecting electrical matching of said second phase shift array means.

25. Apparatus for mixing of electrical signals as claimed in claim 19, wherein said second and fourth matching element means affect matching of said second phase shift array means without affecting electrical matching of said first phase shift array means.

* * * * *